United States Patent
Poon et al.

(10) Patent No.: US 8,780,323 B2
(45) Date of Patent: *Jul. 15, 2014

(54) APPARATUS AND METHOD FOR RECOVERING LIQUID DROPLETS IN IMMERSION LITHOGRAPHY

(75) Inventors: Alex Ka Tim Poon, San Ramon, CA (US); Leonard Wai Fung Kho, San Francisco, CA (US); Gaurav Keswani, Fremont, CA (US)

(73) Assignee: Nikon Corporation, Tokyo (JP)

( * ) Notice: Subject to any disclaimer, the term of this patent is extended or adjusted under 35 U.S.C. 154(b) by 188 days.

This patent is subject to a terminal disclaimer.

(21) Appl. No.: 13/064,232

(22) Filed: Mar. 11, 2011

(65) Prior Publication Data

US 2011/0164239 A1    Jul. 7, 2011

Related U.S. Application Data

(62) Division of application No. 11/583,069, filed on Oct. 19, 2006, now Pat. No. 7,929,109.

(60) Provisional application No. 60/728,313, filed on Oct. 20, 2005.

(51) Int. Cl.
*G03B 27/52* (2006.01)
*G03F 7/20* (2006.01)

(52) U.S. Cl.
CPC ........ *G03F 7/70341* (2013.01); *G03F 7/70925* (2013.01); *G03F 7/70725* (2013.01)
USPC .................. 355/30; 355/53; 355/77

(58) Field of Classification Search
CPC ............ G03F 7/70341; G03F 7/70908; G03F 7/70925; G03F 7/70916; G03F 7/7085; G03F 7/70716; G03F 7/2041; G03F 7/70775
USPC ............................ 355/30, 53, 77
See application file for complete search history.

(56) References Cited

U.S. PATENT DOCUMENTS

| | | | |
|---|---|---|---|
| 5,668,672 A | 9/1997 | Oomura |
| 5,689,377 A | 11/1997 | Takahashi |

(Continued)

FOREIGN PATENT DOCUMENTS

| | | |
|---|---|---|
| EP | 1 628 329 A1 | 2/2006 |
| EP | 1 662 554 A1 | 5/2006 |

(Continued)

OTHER PUBLICATIONS

Shedd et al., "Experimental Characterization of the Receding Meniscus Under Conditions Associated with Immersion Lithograph", Mar. 16, 2006, Proc. SPIE 6154, 61540R, DOI:10.1117/12.658894.

(Continued)

*Primary Examiner* — Steven H Whitesell Gordon
(74) *Attorney, Agent, or Firm* — Oliff PLC

(57) ABSTRACT

Immersion fluid remaining on a portion of a substrate after that portion has passed an immersion nozzle is removed by moving the substrate relative to an immersion nozzle so that the portion of the substrate on which the immersion fluid remains is passed by the immersion nozzle again. A path is determined along which the substrate is to be moved to remove the remaining immersion fluid. The path can be determined based upon previous movements of the substrate, including factors such as the speed and/or length of the previous movements. Alternatively, portions of the substrate on which immersion fluid remains can be detected, and then the substrate can be moved so that the portion of the substrate on which the immersion fluid remains is passed by the immersion nozzle based on the results of the detection. Immersion fluid also can be removed from the stage surface located beyond the substrate.

23 Claims, 7 Drawing Sheets

(56) References Cited

U.S. PATENT DOCUMENTS

| | | | |
|---|---|---|---|
| 5,835,275 A | 11/1998 | Takahashi et al. | |
| 7,388,649 B2 | 6/2008 | Kobayashi et al. | |
| 7,929,109 B2 * | 4/2011 | Poon et al. | 355/53 |
| 2004/0165159 A1 | 8/2004 | Lof et al. | |
| 2005/0225735 A1 | 10/2005 | Magome et al. | |
| 2005/0259232 A1 | 11/2005 | Streefkerk et al. | |
| 2006/0007419 A1 * | 1/2006 | Streefkerk et al. | 355/53 |
| 2006/0119813 A1 | 6/2006 | Hultermans et al. | |
| 2006/0139593 A1 | 6/2006 | Nagasaka et al. | |
| 2006/0152697 A1 | 7/2006 | Poon et al. | |
| 2006/0177777 A1 | 8/2006 | Kawamura et al. | |
| 2006/0231206 A1 | 10/2006 | Nagasaka et al. | |
| 2006/0257553 A1 | 11/2006 | Ohta et al. | |
| 2007/0019172 A1 | 1/2007 | Benson | |
| 2007/0058146 A1 * | 3/2007 | Yamaguchi | 355/53 |
| 2007/0081135 A1 | 4/2007 | Kamono | |

FOREIGN PATENT DOCUMENTS

| | | |
|---|---|---|
| EP | 1 672 681 A1 | 6/2006 |
| EP | 1 713 114 A1 | 10/2006 |
| WO | WO 2004/053952 A1 | 6/2004 |
| WO | WO 2004/105107 A1 | 12/2004 |
| WO | WO 2005/020299 A1 | 3/2005 |
| WO | WO 2005/024517 A2 | 3/2005 |
| WO | WO 2005/036621 A1 | 4/2005 |
| WO | WO 2005/076321 A1 | 8/2005 |
| WO | WO 2005076325 A1 * | 8/2005 |

OTHER PUBLICATIONS

Mar. 24, 2010 Office Action in U.S. Appl. No. 11/583,069.

Dec. 15, 2010 Notice of Allowance in U.S. Appl. No. 11/583,069.

* cited by examiner

APPARATUS AND METHOD FOR RECOVERING LIQUID DROPLETS IN IMMERSION LITHOGRAPHY

CROSS-REFERENCE TO RELATED APPLICATIONS

This is a divisional of U.S. patent application Ser. No. 11/583,069 filed Oct. 19, 2006 (now U.S. Pat. No. 7,929,109), which in turn claims the benefit of U.S. Provisional Patent Application No. 60/728,313 filed Oct. 20, 2005. The disclosure of each of the prior applications is incorporated herein by reference in its entirety.

BACKGROUND

The invention relates generally to immersion lithography apparatus and methods, and particularly to apparatus and methods for recovering droplets of immersion liquid that have been left on a substrate during immersion lithography.

Lithography exposure apparatus are commonly used to transfer images from a reticle onto a semiconductor wafer during semiconductor processing. A typical exposure apparatus includes an illumination source, a reticle stage assembly that positions a reticle containing one or more patterns, a projection system, a wafer stage assembly that positions a semiconductor wafer, and a measurement system that precisely monitors the positions of the reticle and the wafer. As is known, lithography exposure apparatus also can be used to form images on substrates other than semiconductor wafers, for example, glass or quartz substrates in order to form, for example, flat panel displays such as LCD displays.

Immersion lithography is a technique that can enhance the resolution of lithography exposure apparatus by permitting exposure to take place with a numerical aperture (NA) that is greater than the NA that can be achieved in conventional "dry" lithography exposure apparatus. By filling the space between the final optical element of the projection system and the resist-coated target (wafer or other substrate) with immersion fluid, immersion lithography permits exposure with light that would otherwise be internally reflected at an optic-air interface. Numerical apertures as high as the index of the immersion fluid (or of the resist or lens material, whichever is least) are possible in immersion lithography systems. Liquid immersion also increases the wafer depth-of-focus, that is, the tolerable error in the vertical position of the wafer, by the index of the immersion fluid compared to a dry system having the same numerical aperture. Immersion lithography thus has the potential to improve resolution enhancement equivalent to a shift from 193 nm to 157 nm without actually decreasing the exposure light wavelength. Thus, unlike a shift in the exposure light wavelength, the use of immersion would not require the development of new light sources, optical materials (for the illumination and projection systems) or coatings, and should allow the use of the same or similar resists as conventional "dry" lithography at the same wavelength. In an immersion system in which only the final optical element of the projection system and its housing and the wafer (and perhaps portions of the stage as well) are in contact with the immersion fluid, much of the technology and design developed for dry lithography can carry over directly to immersion lithography.

However, because the wafer (or other substrate) moves rapidly in a typical lithography system, some of the immersion fluid in the immersion area between the projection system and the substrate tends to be carried away from the immersion area. If the immersion fluid escapes from the immersion area, that fluid can interfere with operation of other components of the lithography system. One way to prevent the immersion fluid from carrying away from the immersion area is described in WO 2005/24517, which corresponds to U.S. patent application Ser. No. 11/362,833, the disclosure of which is incorporated herein by reference in its entirety. This document discloses an immersion fluid supply and recovery system in which a porous member surrounds the immersion area and is in fluid communication with the space that defines the immersion area. The porous member is maintained at a pressure that is under the bubble point of the porous member, whereby immersion fluid that escapes from the immersion area is captured (recovered) by the porous member.

Other fluid recovery and fluid containment systems have been described. For example, in one such system described in US-2004/0165159-A1, the immersion liquid is maintained in the immersion area by forming an "air curtain" around the immersion area by supplying pressurized gas to the area surrounding the immersion area.

However, even when there is a satisfactory fluid recovery/containment system, droplets of immersion liquid can be left on portions of the substrate after the portion of the substrate has passed beneath the projection system and the underlying immersion area. Such droplets cause local cooling of the wafer and the environment around the wafer when the droplets evaporate, which can have an undesirable effect on the exposure operation. For example, evaporation of the droplets can change the refractive index in the optical path of the detecting light used by the lithography apparatus interferometer(s), and thus adversely affect the measurements made during the exposure operation. Evaporation of the droplets also can leave an area of contamination on the wafer. Furthermore, subsequent high acceleration movements of the substrate can cause droplets to be scattered to surrounding components of the lithography apparatus, causing those components to corrode or at least fouling those components.

WO 2005/020299 and its related US 2006/0139593 A1 disclose an immersion lithography apparatus that moves the substrate relative to an immersion fluid supply/recovery nozzle after the entire substrate has been exposed in order to remove any immersion fluid that may remain on the substrate.

SUMMARY

According to aspects of the invention, immersion fluid that remains on a portion of a substrate is removed from the portion of the substrate by moving the substrate. The immersion fluid that remained on the substrate can be removed by a fluid recovery system. Immersion fluid also can be removed from the stage surface.

According to a preferred embodiment, the substrate is moved so that the portion of the substrate on which the fluid may remain is returned to the immersion area so that the remaining immersion fluid is engulfed by the immersion fluid that is located in the immersion area.

According to one embodiment, a path is determined along which the substrate is to be moved so as to remove the remaining immersion fluid. For example, the path can be determined based upon previous movements of the substrate. The path can be determined based on positional information about the area on the substrate where the droplets are likely to remain. Factors that can be taken into account include the speed and length of the previous movements of the substrate.

According to another embodiment, portions of the substrate on which immersion fluid remains can be detected, and then the substrate can be moved based on the results of the detection to remove the remaining immersion fluid. The detection can be made by an optical detector such as, for example, the auto-focus detector already existing in many immersion lithography apparatus.

As is known, a typical exposure operation forms an image of a pattern onto a plurality of shot areas on a substrate. In accordance with aspects of the invention, the substrate can be moved so as to remove immersion liquid remaining on the substrate at least once between a start time when exposure of a first one of the shot areas on the substrate begins and an end time after the exposure of a last one of the shot areas on the substrate has been completed. According to some embodiments, the remaining immersion fluid removal step can be performed multiple times between the start time and the end time of exposure on the substrate. According to some embodiments, the removal step is performed at least after the exposure of all the shot areas on the substrate has been completed.

According to an aspect of the invention, an immersion lithography apparatus that includes a projection system and a substrate stage that holds a substrate and moves the substrate relative to the projection system, further includes a controller that moves the substrate stage so that the immersion fluid that remains on the portion of the substrate is removed. As noted above, the controller controls the movement of the substrate based upon determinations that can be made regarding portions of the substrate where immersion fluid is likely to remain and/or based upon actual detection of immersion fluid that remains on the substrate.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
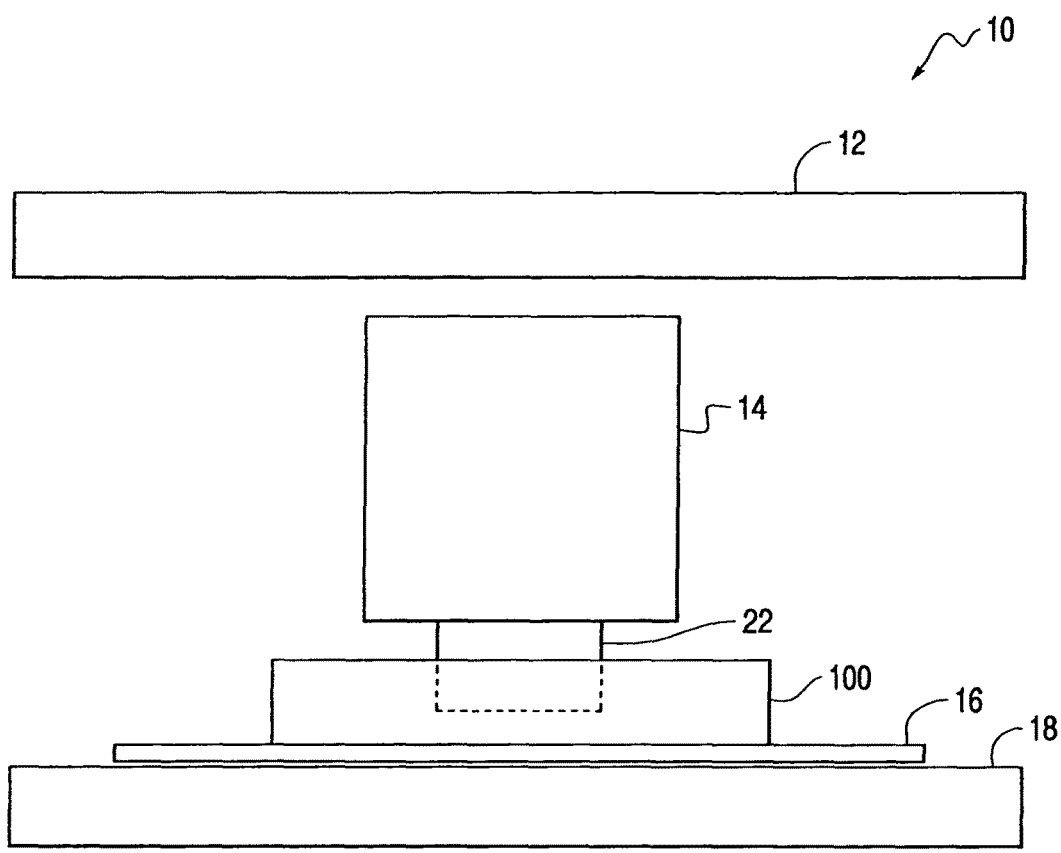
FIG. 1 is a simplified elevational view schematically illustrating an immersion lithography system according to an embodiment of the invention.

FIG. 1 shows an immersion lithography system 10 including a reticle stage 12 on which a reticle is supported, a projection system 14, and a wafer 16 supported on a wafer stage 18. An immersion fluid supply and recovery apparatus 100, which is sometimes referred to herein as an immersion fluid supply and recovery nozzle, is disposed around the final optical element 22 of the projection system 14 so as to provide and recover an immersion fluid, which may be a liquid such as, for example, water between the final optical element 22 and the wafer 16 during an exposure operation. In the present embodiment, the immersion lithography system 10 is a scanning lithography system in which the reticle and the wafer 16 are moved synchronously in respective scanning directions during an exposure operation.

The illumination source of the lithography system can be a light source such as, for example, a mercury g-line source (436 nm) or i-line source (365 nm), a KrF excimer laser (248 nm), an ArF excimer laser (193 nm) or a $F_2$ laser (157 nm). The projection system 14 projects and/or focuses the light passing through the reticle onto the wafer 16. Depending upon the design of the exposure apparatus, the projection system 14 can magnify or reduce the image illuminated on the reticle. It also could be a 1x magnification system.

When far ultra-violet radiation such as from the excimer laser is used, glass materials such as quartz and fluorite that transmit far ultra-violet rays can be used in the projection system 14. The projection system 14 can be catadioptric, refractive or completely reflective.

With an exposure device that employs radiation of wavelength 200 nm or lower, use of the catadioptric type optical system can be considered. Examples of the catadioptric type of optical system are shown in U.S. Pat. No. 5,668,672 and U.S. Pat. No. 5,835,275. In these cases, the reflecting optical device can be a catadioptric optical system incorporating a beam splitter and concave mirror. U.S. Pat. No. 5,689,377 also uses a reflecting-refracting type of optical system incorporating a concave mirror etc., but without a beam splitter, and can also be employed with this invention. The disclosures of the above-mentioned U.S. patents are incorporated herein by reference in their entireties.

Figure 2:
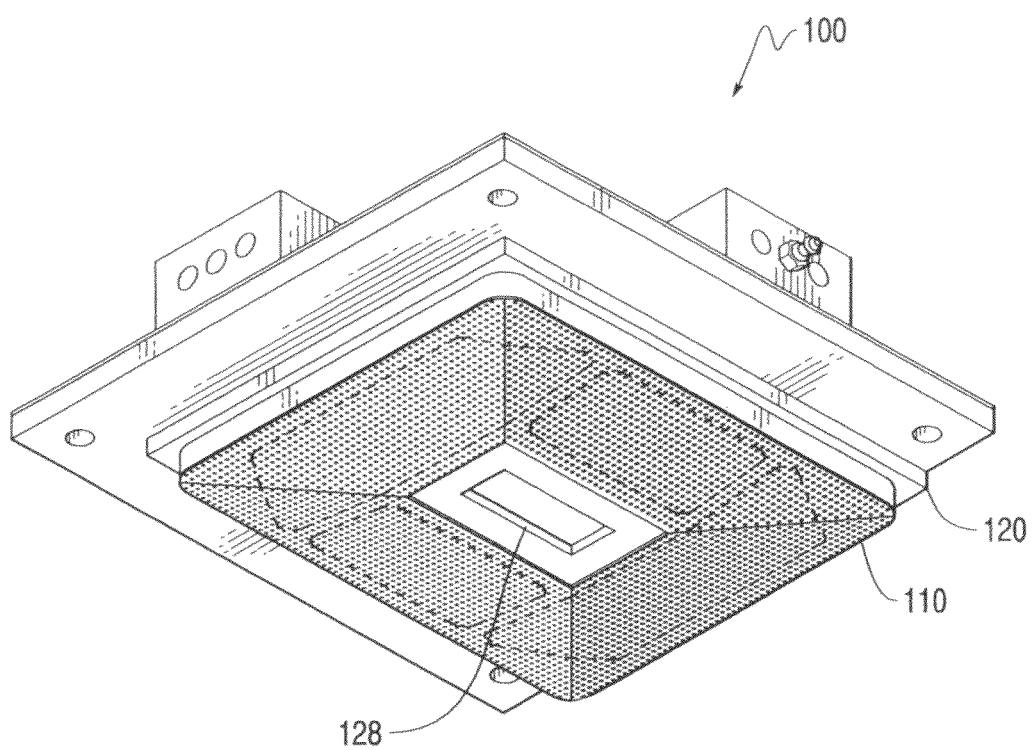
FIG. 2 is a perspective view of a nozzle for fluid delivery and recovery that can be used with the invention.

FIG. 2 is a perspective view of one embodiment of an immersion fluid supply and recovery nozzle 100 according to aspects of the invention. Further details of the immersion fluid supply and recovery nozzle 100 are described in U.S. patent application Ser. No. 11/443,361 filed May 31, 2006. The disclosure of U.S. patent application Ser. No. 11/443,361 is incorporated herein by reference in its entirety. As is generally known from the above-incorporated WO 2005/24517 (and corresponding U.S. patent application Ser. No. 11/362,833), the nozzle 100 includes a housing or manifold portion 120 and a porous member 110. The housing 120 includes various passages through which immersion fluid is supplied to and conveyed away from the gap that includes at least a space between the final optical element 22 of the projection system 14 and the substrate (e.g., wafer 16) that is the object of exposure during exposure.

As can be appreciated from FIG. 1, the nozzle 100 encircles the final optical element 22 of the projection system 14. Because the illustrated embodiment is a scanning exposure apparatus in which the reticle and the substrate are synchronously moved relative to the projection system 14 during exposure, a generally slit-shaped irradiation area is projected through the reticle, projection system 14 and onto the substrate 16. Accordingly, the lower portion of the housing 120 includes a slit-shaped (or rectangular) opening 128. The irradiation beam passes through the opening 128 during exposure. When fully assembled, the porous member 110 encircles the opening 128, as can be seen in FIG. 2. The immersion area is formed in the gap between the final optical element 22 of the projection system 14 and the upper surface of the substrate (e.g., wafer 16). The immersion area is also formed in the gap between the lower surface surrounding the opening 128 of the housing 120 and the upper surface of the substrate. The immersion area generally is located in the area of the opening 128 and the area surrounding the opening 128 between the opening and the inner perimeter of the porous member 110. As described below, immersion fluid such as water is supplied through the housing 120 to the immersion area and is maintained in the immersion area during exposure. As the substrate moves below the projection system 14 and nozzle 100, the porous member 110 that surrounds the immersion area prevents immersion fluid from escaping from the area below the nozzle 100.

The surface of the porous member 110 that faces the wafer 16 (that is, the lower surface of the porous member 110) can be flat or tapered. In the illustrated embodiment, the porous member 110 tapers upwardly from its center toward its radial outer edges. Thus, when positioned adjacent to the wafer 16, the central portion of the porous member 110 (the portion adjacent to central opening 114) is located closer to the wafer 16 than the radially outer edges of the porous member 110.

The porous member 110 may be a mesh or may be formed of a porous material having holes typically with a size smaller than 150 microns. For example, the porous member 110 may be a wire mesh including woven pieces or layers of material made of metal, plastic, or the like, a porous metal, a porous glass, a porous plastic, a porous ceramic, or a sheet of material having chemically etched holes (for example, by photo-etching).

The invention can be used with other immersion nozzle architectures, for example, the invention can be used with immersion nozzles that do not include a porous member, such as the nozzle disclosed in the previously mentioned WO 2005/020299 and its related US 2006/0139593 A1. The disclosures of WO 2005/020299 and US 2006/0139593 A1 are incorporated herein by reference in their entireties.

Figure 3A:
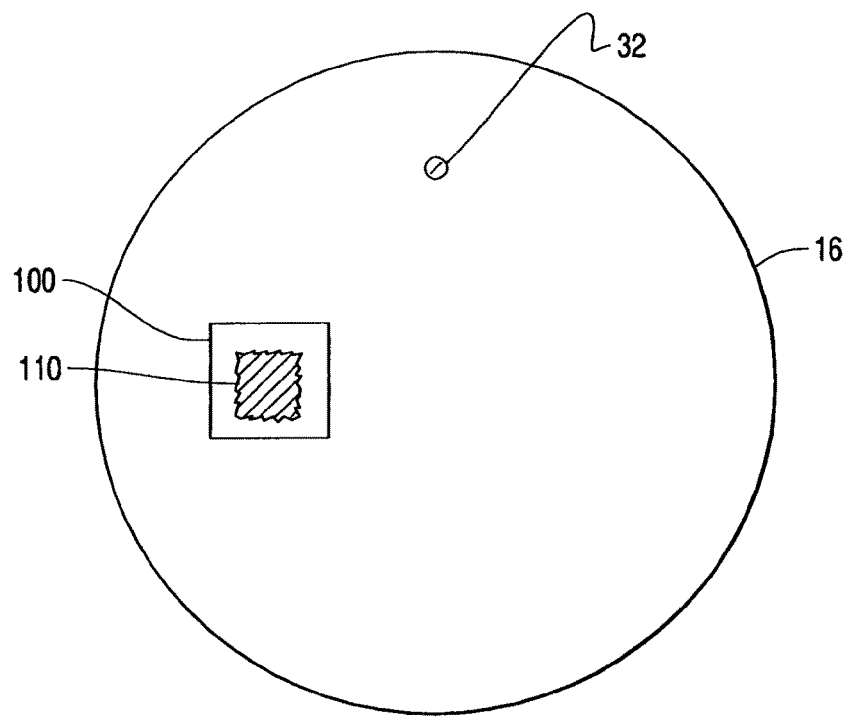
FIGS. 3A and 3B illustrate removal of an immersion fluid droplet from a substrate.
Figure 3B:
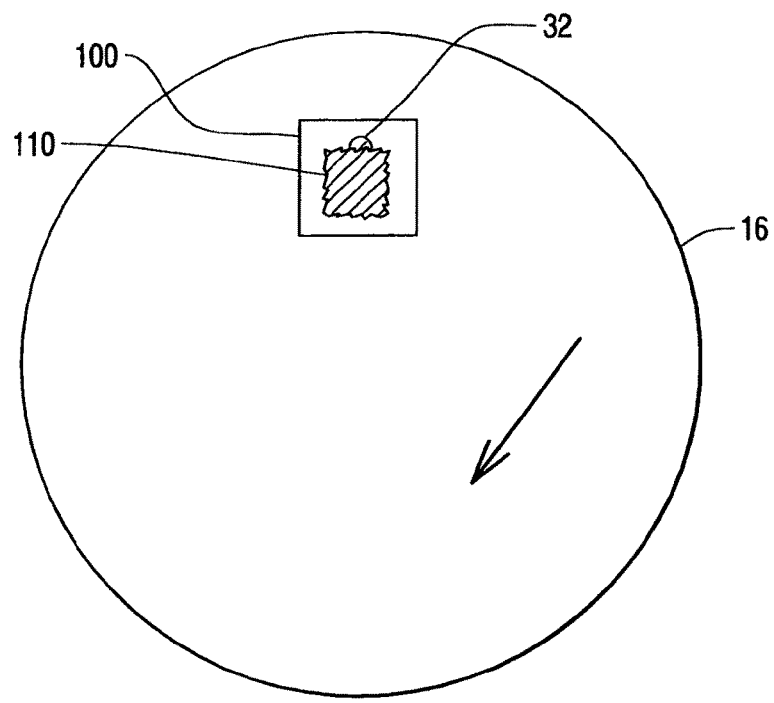

FIGS. 3A and 3B illustrate removal of an immersion fluid droplet 32 from the surface of a substrate 16, such as a silicon wafer. These figures show a plan view of the substrate 16 with an immersion fluid droplet 32 located on the upper surface of the substrate 16. The outer perimeter of the immersion nozzle 100 is shown to be spaced from the immersion area 110. The substrate is moved in the direction of the arrow shown in FIG. 3B so that the immersion fluid droplet 32 that remained on the substrate surface is engulfed by the immersion area 110. Once the droplet 32 is engulfed by the immersion area 110, it can be removed from the surface of the substrate 16.

The invention also can be used to remove fluid droplets that remain on the upper surface of the substrate stage 18 surrounding the substrate 16. As is known, when shot areas in the vicinity of the outer perimeter of the substrate 16 are exposed, at least part of the immersion area 110 can extend beyond the outer perimeter of the substrate 16, and thus immersion fluid from the immersion area 110 can flow onto the upper surface of the substrate stage 18 at these locations. Such immersion fluid sometimes is left on the substrate stage upper surface (i.e., it is not removed by the immersion nozzle 100) due to, for example, the speed at which the substrate stage is moving when these areas are exposed. The invention can be used to remove any remaining immersion fluid from the upper surface of the substrate stage 18.

Figure 4:
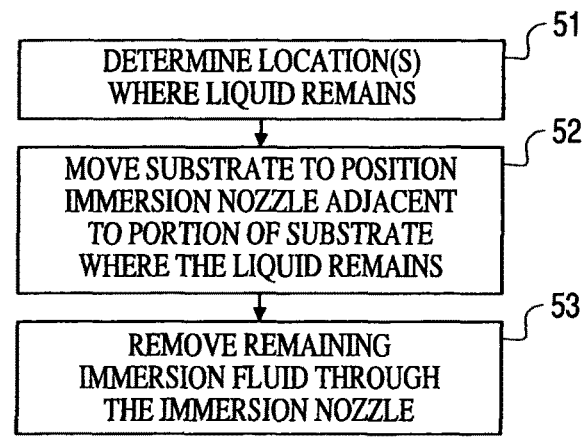
FIG. 4 is a flowchart showing some basic steps performed according to some aspects of the invention when removing immersion fluid that remains on a substrate.

FIG. 4 is a simplified flowchart showing basic steps for implementing aspects of the invention. These steps can be implemented by the immersion lithography apparatus controller 200 illustrated in FIG. 5. In accordance with step S1, a determination is made regarding the one or more locations where fluid remains on the substrate (and/or substrate stage) surface. As will be described in more detail below, the determination can be based on detecting actual locations of remaining immersion fluid or it can be made by determining locations where immersion fluid is likely to remain based upon previous motions of the substrate. After the one or more locations are determined, then in step S2, the substrate is moved so that the immersion nozzle is positioned adjacent to the location(s) where immersion fluid is, or is believed to be, located. Thus, a remaining immersion fluid removal path is determined, and then the substrate 16 is moved along the path so that the substrate is positioned relative to the immersion nozzle 100. Preferably, the substrate is moved so that the immersion area 110 below the immersion fluid nozzle 100 will touch, and thereby engulf, the immersion fluid droplets (or other forms of remaining immersion fluid) present on the substrate and/or substrate stage upper surface. As shown in step S3, the remaining immersion fluid is removed through the immersion nozzle 100 once it is positioned so that the remaining immersion fluid is engulfed by the immersion area 110.

Figure 5:
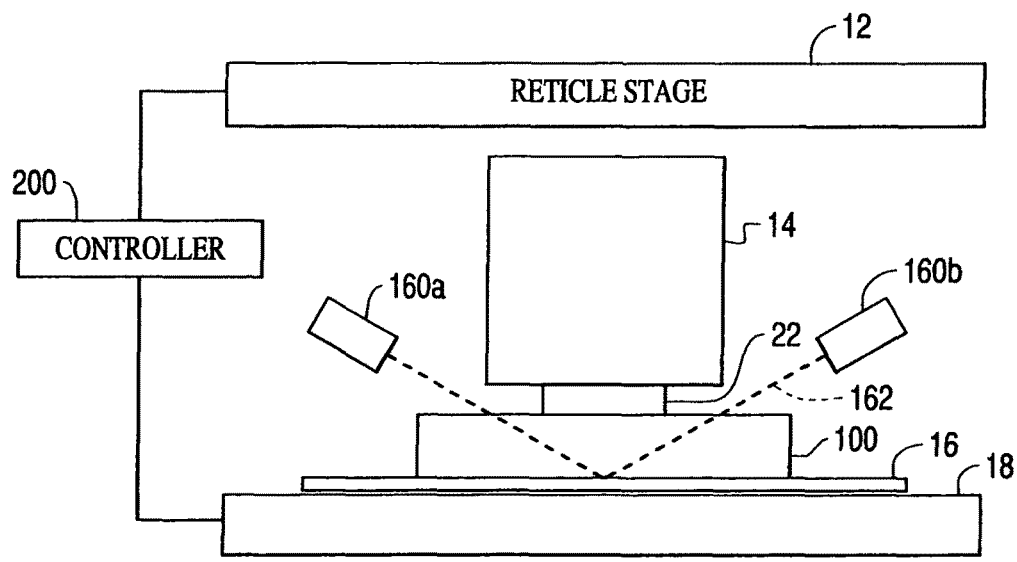
FIG. 5 is a schematic diagram showing an embodiment in which the location(s) of remaining immersion fluid is/are detected using an auto-focus detector of the immersion lithography apparatus.

FIG. 5 shows one arrangement whereby the location of any remaining immersion fluid is detected. A detector, such as an optical detector, is used to detect where immersion fluid remains on the substrate after at least one of the shot areas on the substrate has been exposed with a pattern of an image. In this embodiment, the optical detector used in FIG. 5 is the auto-focus system already existing in immersion lithography apparatus. The auto-focus system includes a light emitting element 160a and a light detecting element 160b. The light emitting element 160a emits one or more beams of light at an oblique angle relative to the substrate upper surface. This light beam is reflected by the upper surface and then detected by the light detector 160b. The light path of the detecting light is identified with reference numeral 162 in FIG. 5.

The auto-focus detector can be arranged so that it projects its light beam at an area adjacent to the immersion area, and thus it can detect whether any droplets are present on portions of the substrate that should be dry. Thus, for example, by moving the substrate after all or some shot areas of the substrate have been exposed with the image pattern, the auto-focus detector can be used to determine whether any immersion fluid remains on the substrate surface. A path then can be determined for moving the substrate so that the remaining immersion fluid is engulfed by the immersion area 110 below the immersion nozzle 100, and thereby removed from the substrate.

Figure 6:
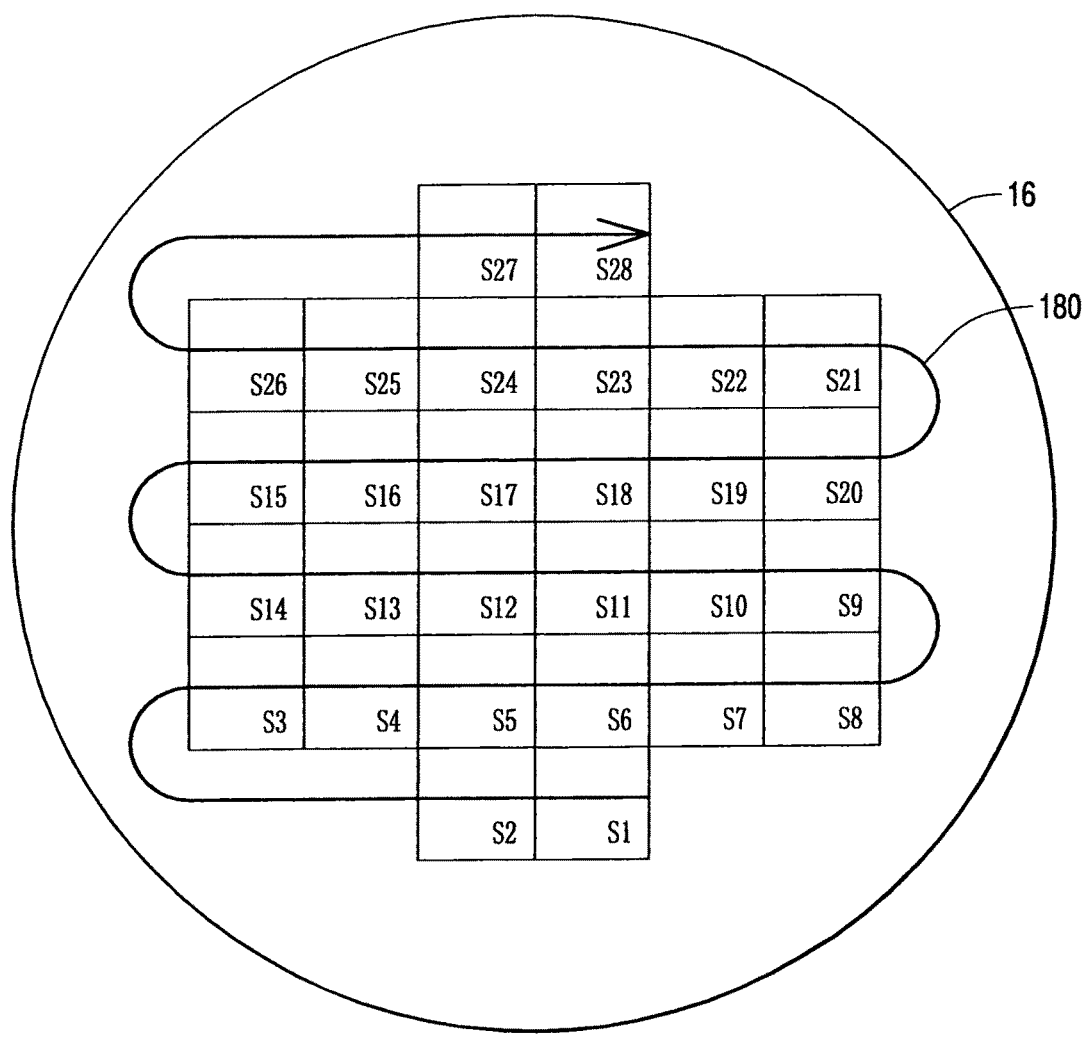
FIG. 6 shows one example of the movement path of a substrate so as to expose the shot areas on the substrate.

FIG. 6 illustrates a plurality of shot areas S1-S28 disposed on the upper surface of the substrate 16. The line 180 denotes the path that the substrate follows in order to expose the shot areas from shot area S1 to shot area S28. According to another aspect of the invention, the path can be used to determine locations on the substrate where immersion fluid likely remains after one or more of the shot areas have been exposed with the pattern image. For example, it can be determined that immersion fluid likely remains on portions of the substrate where the substrate was moved at higher speeds, or subjected to higher accelerations (which occur at locations where the movement direction of the substrate is changed such as at the curved portions of the path 180). Based on such movements, the substrate can be controlled to return the portions of the substrate that likely have remaining immersion fluid back below the immersion nozzle 100 so that the remaining immersion fluid is removed.

The procedure in which the substrate is moved so that locations likely to contain remaining immersion fluid are again passed below the immersion nozzle 100 can take place after all shot areas have been exposed or can take place intermittently during exposure of the shot areas. For example, it may not be desirable to wait until all shot areas have been exposed because fluid remaining on the substrate from the exposure of previous shot areas may be scattered from the substrate or may evaporate before exposure of all shot areas is completed. Thus, it may be desirable to move the substrate so that fluid that remains on the substrate is removed shortly after it is likely that such immersion fluid has been left on the substrate. For example, referring to FIG. 6, since it is likely that immersion fluid remains in the area between shot areas S2 and S3, it may be desirable to move the substrate to remove such remaining immersion fluid after shot area S14 has been exposed with the pattern image. Similarly, because immersion fluid likely remains on the substrate along the path 180 between shot areas S8 and S9, it would be desirable to move the substrate so as to remove such immersion fluid after exposure of shot area S20. The path along which the substrate is moved also can be determined so as to maximize throughput.

There are a number of different types of lithographic apparatus, and although the illustrated embodiment is a scanning exposure apparatus, the invention also can be used with step-and-repeat type photolithography apparatus that expose the pattern from the reticle onto the substrate while the reticle and the substrate are stationary. In the step and repeat process, the substrate is in a constant position relative to the reticle and the projection system during the exposure of an individual field (shot area). Subsequently, between consecutive exposure steps, the substrate is consecutively moved with a substrate stage assembly perpendicularly to the optical axis of the projection system so that the next shot area of the substrate is brought into position relative to the projection system and the reticle for exposure. Following this process, the images on the reticle are sequentially exposed onto the shot areas of the substrate, and then the next shot area of the substrate is brought into position relative to the projection system and the reticle.

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate or a photolithography system for manufacturing a thin film magnetic head.

Figure 7A:
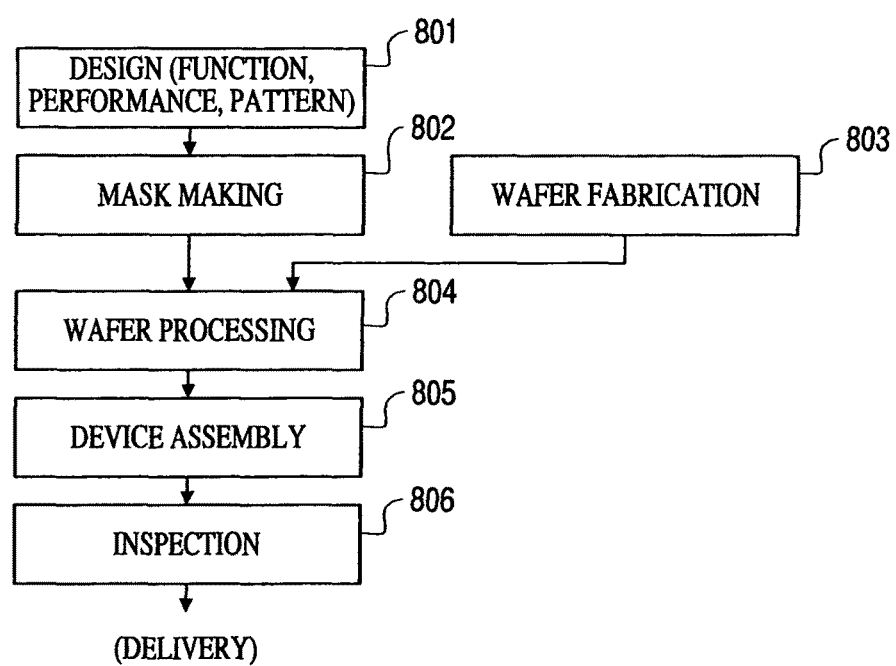
FIG. 7A is a flowchart that outlines a process for manufacturing a device in accordance with aspects of the invention.

Semiconductor devices can be fabricated using the above described systems, by the process shown generally in FIG. 7A. In step 801 the device's function and performance characteristics are designed. Next, in step 802, a mask (reticle) having a pattern is designed according to the previous designing step, and in a step 803 a wafer is made from a silicon material. The mask pattern designed in step 802 is exposed onto the wafer from step 803 in step 804 by a photolithography system described hereinabove in accordance with the invention. In step 805 the semiconductor device is assembled (including the dicing process, bonding process and packaging process). Finally, the device is then inspected in step 806.

Figure 7B:
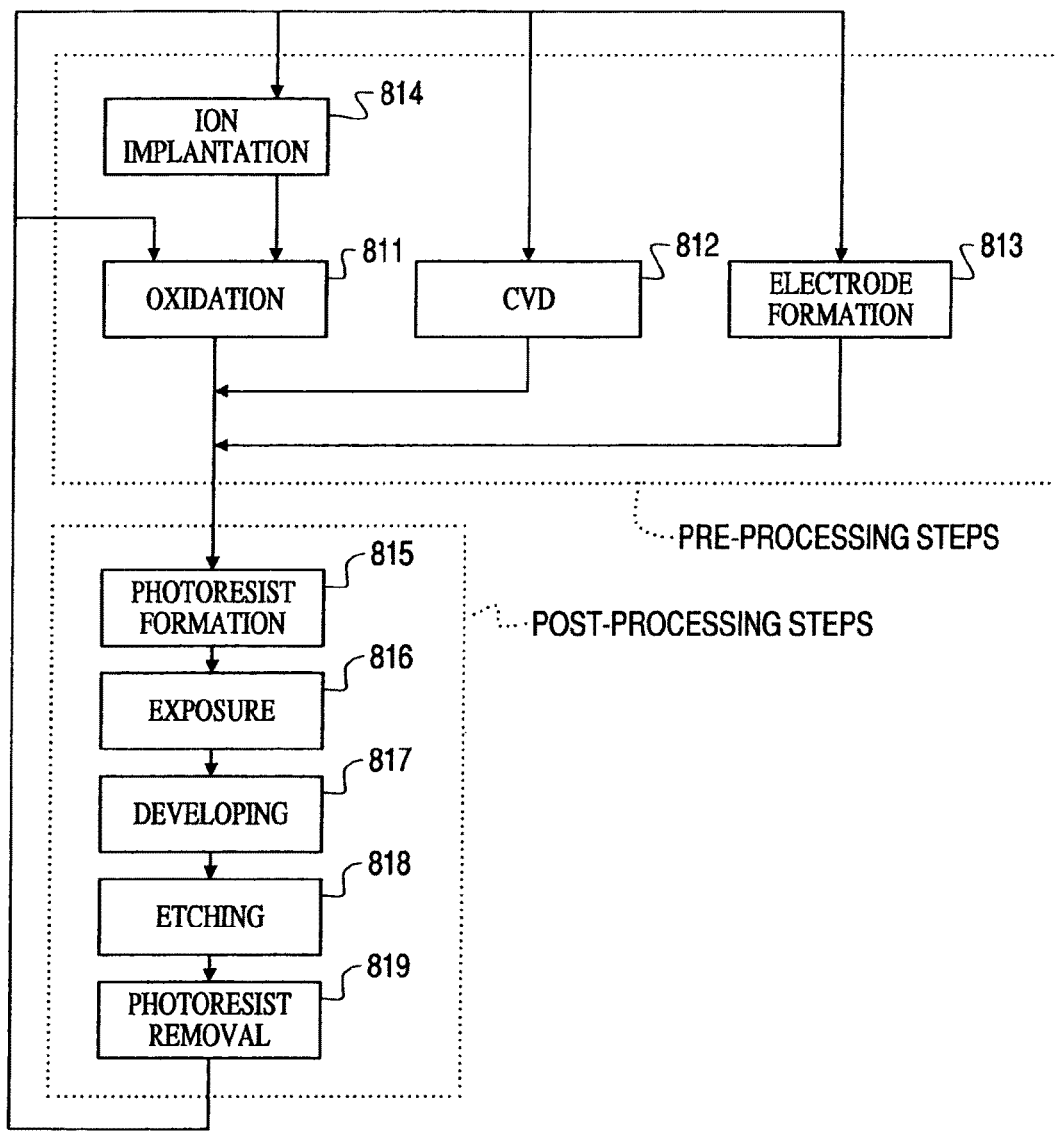
FIG. 7B is a flowchart that outlines device processing in more detail.

FIG. 7B illustrates a detailed flowchart example of the above-mentioned step 804 in the case of fabricating semiconductor devices. In FIG. 7B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A method used in an immersion lithography apparatus, the method comprising:
exposing a substrate with radiation through a projection system and through an immersion liquid that forms an immersion area adjacent to the projection system; and
moving an object such that the immersion area formed adjacent to the projection system is moved on the object to return to a portion of the object on which a residual liquid remains from a prior movement of the immersion area past the portion of the object so that the immersion area touches, and thereby engulfs, the residual liquid so as to remove the residual liquid from the object.

2. The method according to claim 1, wherein the portion of the object includes a portion of a surface of a substrate stage on which the substrate is held.

3. The method according to claim 1, wherein the portion of the object includes a portion of a surface of the substrate.

4. The method according to claim 1, wherein the residual liquid is removed by moving the immersion area over the portion of the object.

5. The method according to claim 2, wherein the surface of the substrate stage includes a portion over which the immersion area extends at a time when an outer perimeter of the substrate is exposed.

6. The method according to claim 1, wherein the residual liquid is removed after the substrate has been exposed.

7. The method according to claim 1, wherein removal of the residual liquid takes place intermittently during an exposure operation.

8. The method according to claim 1, wherein removal of the residual liquid takes place after a first shot area of the substrate is exposed.

9. The method according to claim 1, further comprising:
detecting optically the residual liquid by an optical detector before the removal of the residual liquid.

10. The method according to claim 2, wherein the residual liquid that remains on the surface of the substrate stage is in the form of droplets.

11. The method according to claim 3, wherein removal of the residual liquid on the surface of the substrate takes place intermittently during an exposure operation of the substrate.

12. The method according to claim 3, wherein removal of the residual liquid on the surface of the substrate takes place after a first shot area of the substrate is exposed.

13. The method according to claim 3, wherein removal of the residual liquid on the surface of the substrate takes place after the substrate has been exposed.

14. The method according to claim 3, wherein removal of the residual liquid on the surface of the substrate takes place several times during an exposure operation of the substrate.

15. The method according to claim 2, wherein removal of the residual liquid on the surface of the substrate stage takes place several times during an exposure operation of the substrate.

16. The method according to claim 2, wherein removal of the residual liquid on the surface of the substrate stage takes place before the exposed substrate is transferred to a developing device.

17. The method according to claim 1, wherein the portion of the object includes a portion where the residual liquid is likely to remain.

18. The method according to claim 1, wherein the object moves along a moving path for the removal of the residual liquid.

19. The method according to claim 18, wherein the moving path is determined based on a detection of the residual liquid on the portion of the object.

20. The method according to claim 1, wherein the residual liquid is recovered through a nozzle which forms the immersion area between the projection system and the object.

21. A device manufacturing method comprising:
exposing a substrate by using the method of performing immersion lithography defined in claim 1; and
developing the exposed substrate.

22. A method used in an immersion lithography apparatus, the method comprising:
exposing a substrate with radiation through a projection system and through an immersion liquid that forms an immersion area adjacent to the projection system; and
moving an object such that the immersion area formed adjacent to the projection system is moved on the object, to a location of a portion of the object previously determined to have, or to likely have, residual liquid thereon from a prior movement of the immersion area past the portion of the object, so that the immersion area touches, and thereby engulfs, the residual liquid so as to remove the residual liquid that remains on the portion of the object.

23. A method used in an immersion lithography apparatus, the method comprising:
exposing a substrate with radiation through a projection system and through an immersion liquid that forms an immersion area adjacent to the projection system;
determining a location of a portion of an object where the immersion liquid remains, or is likely to remain, as residual liquid after the exposing; and
moving the object based on the determined location such that the immersion area formed adjacent to the projection system is returned to the portion of the object so that the immersion area touches, and thereby engulfs, the residual liquid so as to remove the residual liquid from the portion of the object.

* * * * *